(12) United States Patent
Mickle et al.

(10) Patent No.: US 7,480,876 B2
(45) Date of Patent: *Jan. 20, 2009

(54) METHOD AND SOFTWARE TOOL FOR DESIGNING AN INTEGRATED CIRCUIT

(75) Inventors: Marlin H. Mickle, Pittsburgh, PA (US); Swapna Dontharaju, Pittsburgh, PA (US); Raymond R. Hoare, Pittsburgh, PA (US); James T. Cain, Pittsburgh, PA (US); Alex Jones, Pittsburgh, PA (US)

(73) Assignee: University of Pittsburgh - Of the Commonwealth System of Higher Education, Pittsburgh, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/835,687

(22) Filed: Aug. 8, 2007

(65) Prior Publication Data

US 2008/0028355 A1    Jan. 31, 2008

Related U.S. Application Data

(63) Continuation-in-part of application No. 11/406,194, filed on Apr. 18, 2006.

(60) Provisional application No. 60/823,301, filed on Aug. 23, 2006.

(51) Int. Cl.
*G06F 17/50* (2006.01)

(52) U.S. Cl. .................. 716/3; 716/17; 716/18
(58) Field of Classification Search .......... 716/3, 716/17, 18
See application file for complete search history.

(56) References Cited

U.S. PATENT DOCUMENTS

| 5,841,663 | A  | 11/1998 | Sharma et al. |
| 6,408,428 | B1 | 6/2002 | Schlansker et al. |
| 6,470,482 | B1 | 10/2002 | Rostoker et al. |
| 6,591,403 | B1 | 7/2003 | Bass et al. |

(Continued)

OTHER PUBLICATIONS

Jones et al., "An FPGA-based VLIW Processor with Custom Hardware Execution", FPGA 2005, Feb. 20-22, Monterey, California, pp. 107-117.

(Continued)

*Primary Examiner*—Stacy A Whitmore
*Assistant Examiner*—Magid Y Dimyan
(74) *Attorney, Agent, or Firm*—Philip E. Levy; Eckert Seamans Cherin & Mellott, LLC

(57) ABSTRACT

A method of designing an integrated circuit for an application having standards having a plurality of primitives, each of the primitives having a corresponding response. The method includes generating a macros description of each of the primitives and the response corresponding to each of the primitives, wherein the macros description includes information relating to a number of first fields for each of the primitives and a number of second fields for the response corresponding to each of the primitives. The method further includes receiving a specification of the behavior of the integrated circuit in response to the primitives that has one or more values specified for each of the second fields, and generating a hardware description language representation for the integrated circuit based on the macros description and the specification. Also, a software tool which implements the method.

15 Claims, 8 Drawing Sheets

U.S. PATENT DOCUMENTS

| | | |
|---|---|---|
| 6,874,134 B1 | 3/2005 | Collin et al. |
| 2002/0120914 A1 | 8/2002 | Gupta et al. |
| 2002/0133784 A1 | 9/2002 | Gupta et al. |
| 2008/0028355 A1 | 1/2008 | Mickle et al. |

OTHER PUBLICATIONS

Hoare et al., "Rapid VLIW Processor Customization for Signal Processing Applications Using Combinational Hardware Functions", EURASIP Journal on Applied Signal Processing, vol. 2006, Article ID 46472, pp. 1-23.

"OWNERID WRITE" COMMAND FORMAT

| Prefix | Type | OwnerID | Tag ID | Interragator ID | Command Code | CRC |
|---|---|---|---|---|---|---|
| 8 Bits | 8 Bits | 24 Bits | 32 Bits | 16 Bits | 8 Bits | 16 Bits |

RESPONSE FORMAT

| Tag Status | Message Length | Interragator ID | Tag ID | Command Code | CRC |
|---|---|---|---|---|---|
| 16 Bits | 8 Bits | 16 Bits | 32 Bits | 8 Bits | 16 Bits |

TAG STATUS FORMAT

| Mode Field | Reserved | Acknowledge | Reserved | Tag Type | Reserved | User ID | Battery |
|---|---|---|---|---|---|---|---|
| 4 Bits | 3 Bits | 4 Bits | 2 Bits | 3 Bits | 1 Bit | 1 Bit | 1 Bit |

FIG. 3

```
declarations
prefix (8)
type (8)
ownerid (24)
interid (16)
tagid (32)
comcode (8)
siz (16)
res (8)
crc (16)
tagstatus (16) [
    modefield (4)
    reserved1 (3)
    acknowledge (4)
    reserved2 (2)
    tagtype (3)
    reserved3 (1)
    userid (1)
    battery (1)
]
mesglen (8)

main
ionw (137)    prefix    type      ownerid    tagid     interid    comcode    crc
              tagstatus mesglen   interid    tagid     comcode    crc
icol (16)     prefix    type      ownerid    interid   comcode    siz        res    crc
              tagstatus mesglen   interid    tagid     ownerid    crc
```

FIG. 4

```
// Behavioral C of ICOL follows
TAGSTATUS .modefield =
TAGSTATUS .reserved1 =
TAGSTATUS .acknowledge =
TAGSTATUS .reserved2 =
TAGSTATUS .tagtype =
TAGSTATUS .reserved3 =
TAGSTATUS .userid =
TAGSTATUS .battery =

RESPONSE .mesglen =
RESPONSE .interid =
RESPONSE .tagid =
RESPONSE .ownerid =
RESPONSE .crc =
```

FIG. 5(a)

```
TAGSTATUS .modefield = 0;
TAGSTATUS .reserved1 = 7;

if (commandValid)
   TAGSTATUS .acknowledge = 0;
else
   TAGSTATUS .acknowledge = 1;

TAGSTATUS .reserved2 = 3;
TAGSTATUS .tagtype = 2;
TAGSTATUS .reserved3 = 1;
TAGSTATUS .userid = 1;
TAGSTATUS .battery = 0;
RESPONSE .mesglen = 112;
RESPONSE .interid = interid;
RESPONSE .tagid = tagid;
RESPONSE .ownerid = ownerid;
RESPONSE .crc = crc;
```

FIG. 5(b)

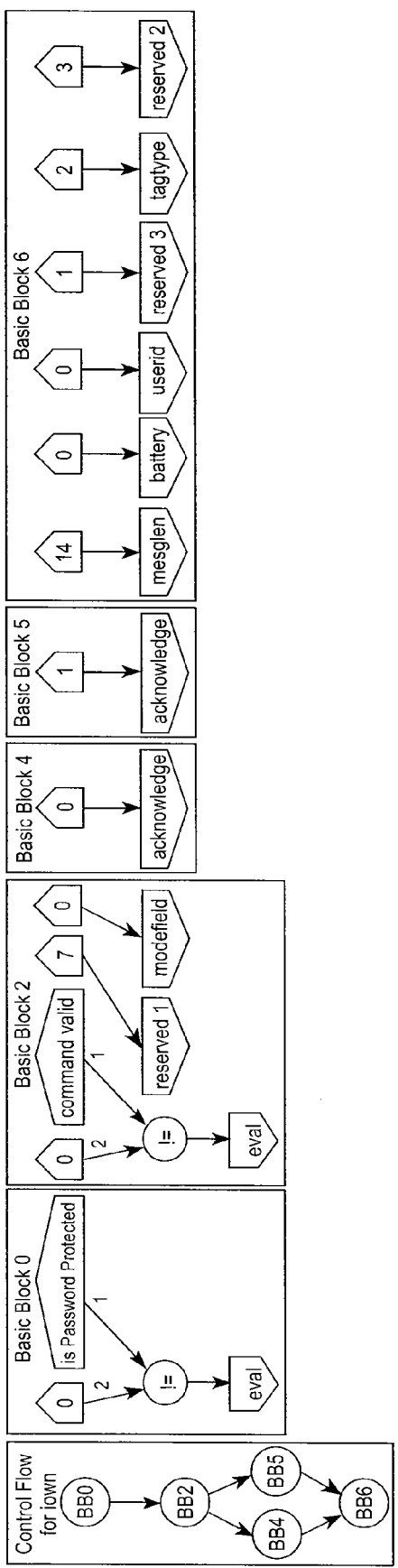
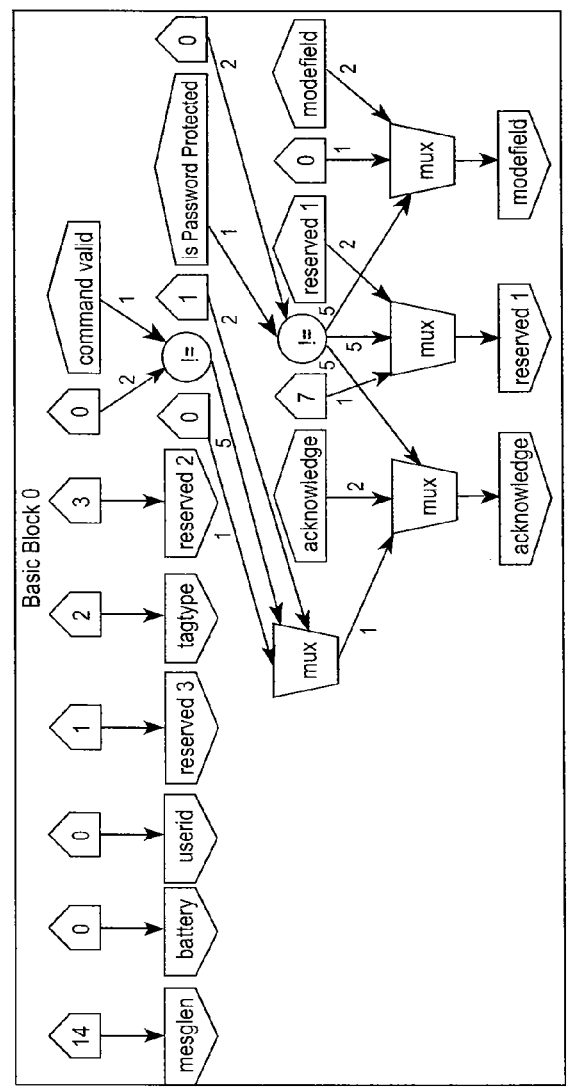
FIG. 6(a)
FIG. 6(b)

```
declarations
prefix (8)
type (8)
ownerid (24)
interid (16)
tagid (32)
comcode (8)
siz (16)
res (8)
crc (16)
tagstatus (16) [
        modefield(4)
        reserved1 (3)
        acknowledge (4)
        reserved2 (2)
        tagtype (3)
        reserved3 (1)
        userid (1)
        battery (1)

]
mesglen (8)
error (8)
position (16)
makedate (8)
prodcode (32)
```

| main | | | | | | | |
|---|---|---|---|---|---|---|---|
| ionw (137) | prefix | type | ownerid | tagid | interid | comcode | crc |
|  | tagstatus | mesglen | interid | tagid | comcode | crc | |
| icol (16) | prefix | type | ownerid | interid | comcode | siz | res | crc |
|  | tagstatus | mesglen | interid | tagid | ownerid | crc | |
| ager (26) | comcode | interid | tagid | crc | | | |
|  | tagid | interid | error | crc | | | |
| abpn (28) | comcode | interid | tagid | crc | | | |
|  | tagid | interid | crc | | | | |
| spos (01) | comcode | interid | tagid | position crc | | | |
|  | tagid | interid | crc | | | | |
| gpos (2) | comcode | interid | tagid | crc | | | |
|  | tagid | interid | position | crc | | | |
| gdat (03) | comcode | interid | tagid | crc | | | |
|  | tagid | interid | makedate | crc | | | |
| gcod (04) | comcode | interid | tagid | crc | | | |
|  | tagid | interid | prodcode | crc | | | |

FIG. 7

METHOD AND SOFTWARE TOOL FOR DESIGNING AN INTEGRATED CIRCUIT

CROSS-REFERENCE TO RELATED APPLICATION

This is a continuation-in-part of U.S. application Ser. No. 11/406,194, entitled "Method And Software Tool For Automatic Generation Of Software For Integrated Circuit Processors," which was filed on Apr. 18, 2006, which application claims the benefit of U.S. Provisional Application No. 60/672,347, entitled "Method For Automatic Generation Of Software For Integrated Circuit Microprocessors," which was filed on Apr. 18, 2005. This application also claims the benefit of U.S. Provisional Application No. 60/823,301, entitled "Method And Software Tool For Fabricating An Integrated Circuit," which was filed on Aug. 23, 2006, the disclosure of which is incorporated herein by reference.

FIELD OF THE INVENTION

The present invention relates to the design and creation of custom integrated circuits including rapid prototyping and production circuits and devices, and in particular to a method and associated software tool for designing a custom integrated circuit, including an FPGA (Field Programmable Gate array), such as an integrated circuit forming part of an RFID tag.

BACKGROUND OF THE INVENTION

Many current devices and systems employ integrated circuits (ICs) that are customized and tailored to a particular application. Such ICs include microprocessors that execute software that has been custom designed for the particular application in question or custom designed/implemented integrated circuits such as, without limitation, a programmable logic device, such as a field programmable gate array (FPGA), for which the logic functions have been defined (programmed) by the user using the appropriate development software. For example, the use of radio frequency identification (RFID) systems is expanding rapidly in a wide range of application areas. RFID systems consist of radio frequency tags or transponders and radio frequency readers or interrogators. The RFID tags include ICs and an antenna for communication over an air interface. The RFID readers query the RFID tags for information stored on them, which can be, for example, identification numbers, user written data, or sensed data. RFID systems have thus been applied in many application areas to track, monitor, report and manage items as they move between physical locations.

Most RFID systems are implemented using customized requirements that are defined ad hoc. In addition, multiple, often competing, standards exist for RFID hardware, software and data management. As a result, in most applications, RFID tag and reader hardware and software must be specifically designed for each particular application, and must be modified or re-designed every time the specification for the current application is adjusted, new applications are introduced, and/or the standards are modified or new standards are developed. Thus, as RFID systems exemplify, the underlying feature in many IC applications is the use of proprietary hardware and software that is non-reusable and tailored to the particular application in question.

The design, development, and fabrication of customized ICs constitute a very costly and time consuming process. As an example, the license for a single seat for software to do commercial IC design can cost as much as $350,000 per year. In addition, the salary of a person qualified to design an IC device can be significant. As a result, many small companies are, from a cost standpoint, prohibited from designing their own ICs, and must instead pay for another party to do the customization.

There are also numerous commercially available generic ICs, such as those on RFID tags and ICs used in other communications applications or related areas, that include embedded microprocessors. These generic ICs can be customized for a particular application using the software that is executed by the IC microprocessor. However, with prior art technology, this customization process is difficult and costly, and therefore is not always a viable solution for many companies, particularly smaller ones, to do on their own. Co-pending application Ser. No. 11/406,194, entitled "Method And Software Tool For Automatic Generation Of Software For Integrated Circuit Processors" and assigned to the assignee hereof, the disclosure of which is incorporated herein by reference, addresses this problem by providing a method and software tool for generating software code for execution by an embedded processor of an IC, such as those on an RFID tag, that includes a compilation flow that automatically generates the software code based on a simple input description of the IC's standards or requirements.

As will be appreciated by those of skill in the art, the overhead of using an embedded microprocessor based controller in an application such as an RFID application is considerable. For example, many current embedded microprocessors operate in the hundreds of mW range and can require hundreds of instructions to be executed to perform a particular function, such as the generation of a required response in the RFID domain. Non-microprocessor ICs, on the other hand, may be designed so as to consume less energy. However, as described above, such design is currently very costly and time consuming and thus prohibitive for many small companies. It would therefore be advantageous to have a hardware based solution that enables simplified and cost effective design and creation of custom ICs.

SUMMARY OF THE INVENTION

In one embodiment, the invention provides a method of designing an integrated circuit, such as an FPGA, for an application having standards having a plurality of primitives (commands of a serial nature), each of the primitives having a corresponding response (primitive or command of a similar form). For example, the integrated circuit may be part of an RFID tag. The method includes generating a macros description of each of the primitives and the response corresponding to each of the primitives, wherein the macros description includes information relating to a number of first fields for each of the primitives and a number of second fields for the response corresponding to each of the primitives. The method further includes receiving a specification of the behavior of the integrated circuit in response to the primitives that has a value specified for each of the second fields, and generating a hardware description language representation for the integrated circuit based on the macros description and the specification. In one particular embodiment, the method further includes generating a blank version of a template that includes each of the second fields, wherein the specification comprises a completed version of the template. The method may also further include using the hardware description language representation to produce a layout for the integrated circuit and fabricating the integrated circuit using the layout. The integrated circuit may be an FPGA, in which case the method may further include programming the FPGA based on the hardware description language representation.

In another particular embodiment, the macros description is also a macros description of one or more custom primitives and a second response to each of the custom primitives. In this embodiment, the macros description further includes information relating to a number of third fields for each of the one or more custom primitives and a number of fourth fields for the second response corresponding to each of the one or more custom primitives. The blank version of the template includes each of the fourth fields, and the completed version of the template has a value specified for each of the fourth fields and specifies a behavior of the integrated circuit in response to the one or more custom primitives.

The invention also provides a software tool which implements one or more of the method embodiments described above.

The invention is extensible as it allows for addition (or removal) of a set of custom primitives that may be a subset or superset of the original standard. Because of its extensible nature, the invention can accommodate for multiple, often competing, standards such as existing efforts from ISO and ANSI while also serving the needs of current and future applications.

BRIEF DESCRIPTIONS OF THE DRAWINGS

The accompanying drawings illustrate presently preferred embodiments of the invention, and together with the general description given above and the detailed description given below, serve to explain the principles of the invention as shown throughout the drawings, like reference numerals designate like corresponding parts.

FIGS. 1(a) and 1(b) are schematic diagrams of alternative embodiments of a typical RFID system;

FIG. 3 is a schematic representation showing the format of the fields of a particular RFID primitive and response;

FIG. 4 shows an RFID macros specification of the RFID primitive and response shown in FIG. 3;

Figure 1A:
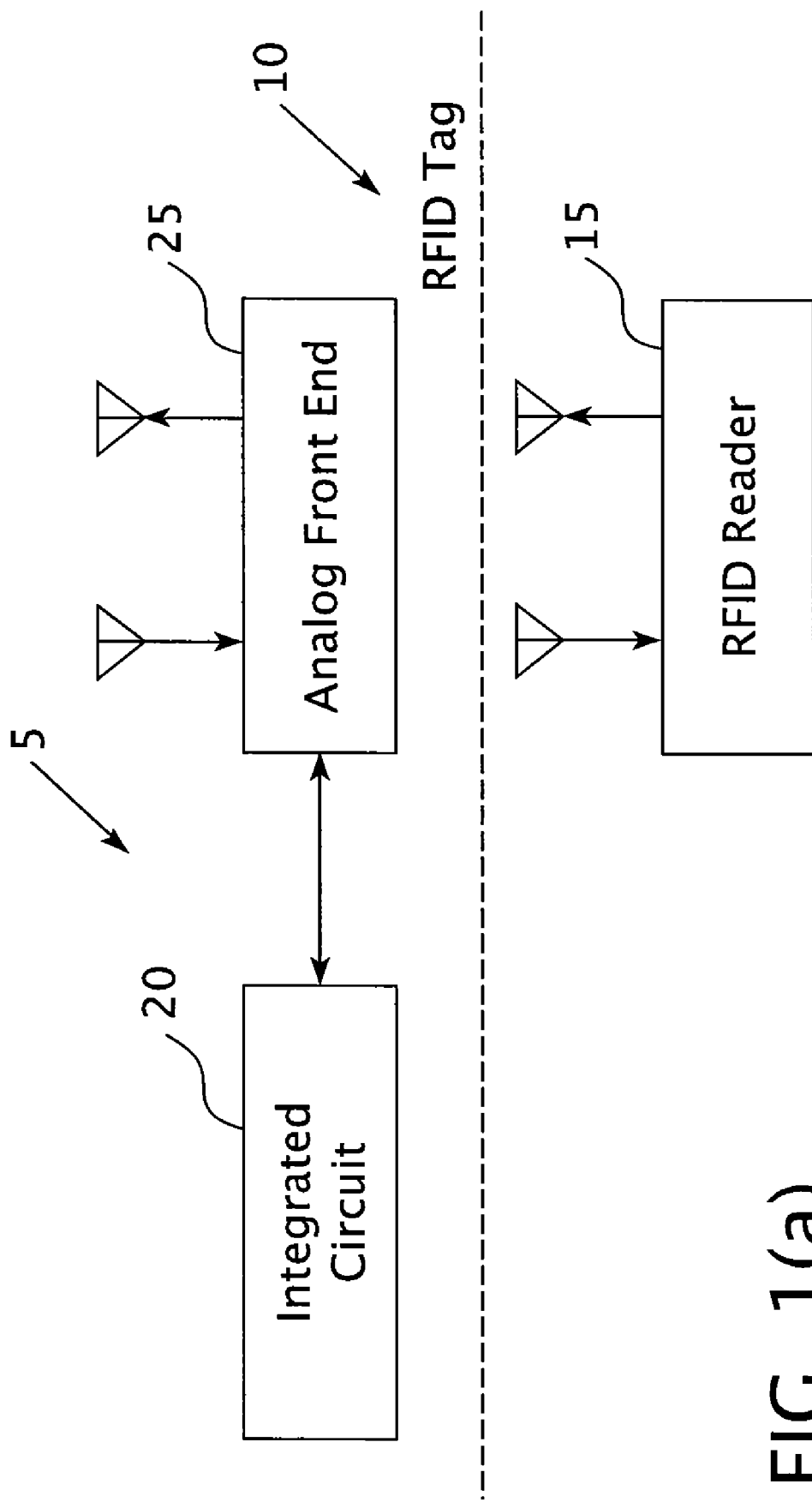

FIGS. 5(a) and 5(b), respectively, are uncompleted and completed templates for specifying response behavior for a RFID primitive;

FIGS. 6(a) is a schematic representation of a control and data flow graph (CDFG) for the "Owner id write" (iown) primitive;

FIG. 6(b) is a schematic representation of a super data flow graph (SDFG) for the "Owner id write" (iown) primitive; and FIG. 7 shows an extended macros specification according to a further aspect of the present invention.

DESCRIPTION OF THE PREFERRED EMBODIMENTS

Numerous communications standards for ICs, such as those on RFID tags, are specified in terms of what are commonly known as primitives. Primitives are the commands that are to be sent to the IC as specified in the standard. Once a primitive is received, the IC is to respond in some manner. This response may be: (1) a change in state of the IC (and/or the device including the IC such as an RFID tag), (2) a message transmitted from the IC to another device such as a base station or other receiver, or (3) both (1) and (2). Each primitive typically includes a number of data fields of varying length that include a field for specifying the command type and one or more fields for containing data.

Each primitive is similar in concept to an assembly language instruction that, once assembled in machine code format (an array of bits) and executed, causes some resultant behavior of the IC. Thus, the primitive is converted into a binary coded string (like a machine language instruction) that is transmitted to an IC, such as over an air interface to an RFID tag. The IC precipitates a behavior (decode and state change) resulting in a state change (memory or register change) and possibly a data response transmission through a communications channel to a receiving device, such as through an air interface to an RFID reader.

As described above, the custom fabrication of an Application Specific IC (ASIC) to be employed in, for example, an RFID tag, is cost prohibitive for many companies. To be commercially viable, the company would have to produce an ASIC that satisfies existing and applicable standards specified in the form of the primitives of the standards. As is known in the art, a hardware description language (HDL) is a language that is used to describe IC hardware in such a way that a layout can be generated from the description, and is typically the last step before the physical layout for the IC is created. One particular type of HDL, known VHSIC Hardware Description Language (HHDL), is commonly used as a design-entry language for programmable logic devices, such as FPGAs. The present invention provides a path from a set of input macros, based on the applicable primitives, that automatically generates HDL for an IC according to the desired system behavior of each macro as defined by the user.

For ease of description herein, the invention will be described in terms of an RFID implementation. However, as will be appreciated, the methodology and compilation flow of the present invention may be used to design other types of generic ICs, such as those used in various communications applications.

Figure 1B:
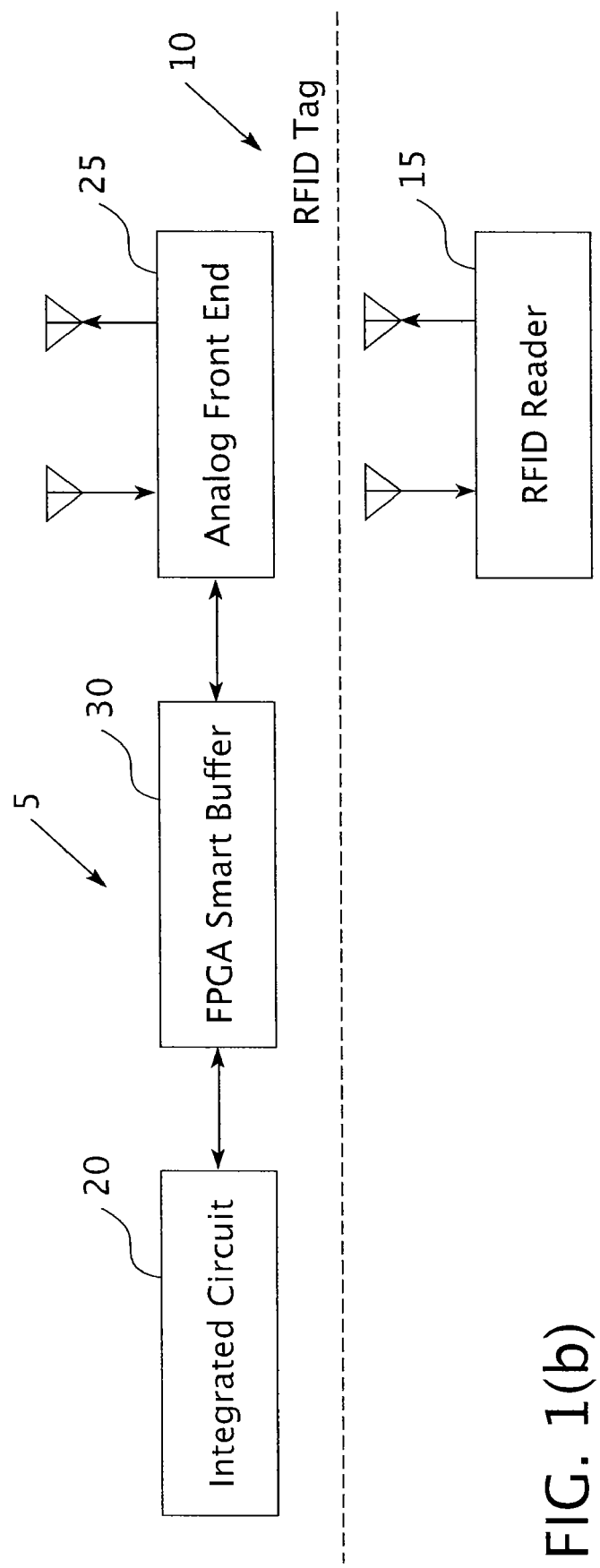
Figure 2:
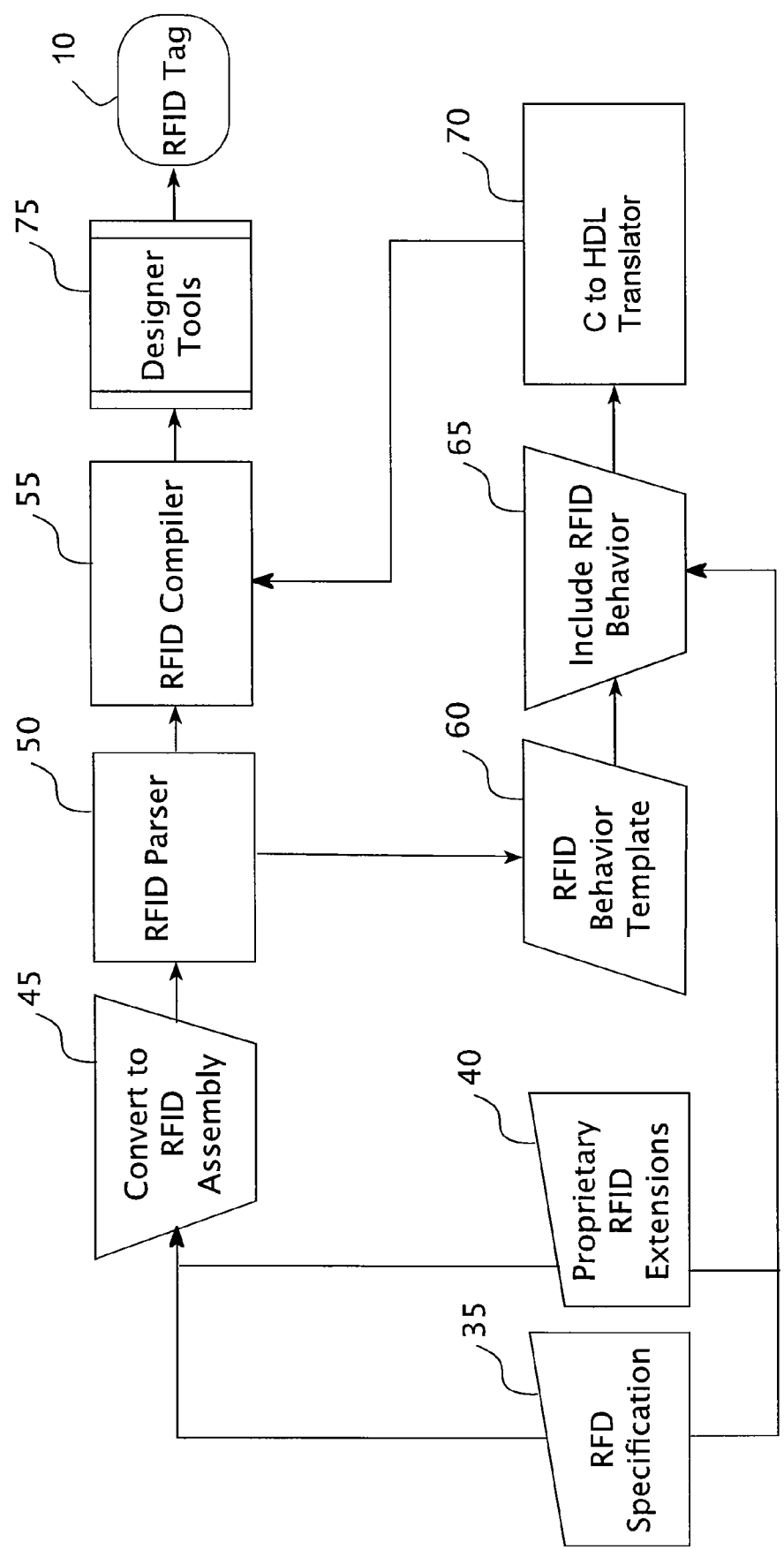
FIG. 2 is a schematic flow diagram illustrating an embodiment of the method of the present invention.

As shown in FIGS. 1(a) and 1(b), a typical RFID system 5 consists of an RFID tag 10 and an RFID reader 15. In the case of the embodiment of FIG. 1(a), The RFID tag 10 includes an integrated circuit 20, such as a user programmed FPGA, and an analog front end 25 having receiver and transmitter circuitry. Alternatively, in the case of the embodiment of FIG. 1(b), the RFID tag 10 includes an integrated circuit 20, a smart input/output buffer/co-processor implemented in custom hardware for the integrated circuit 20, such as an FPGA smart buffer coprocessor 30, and an analog front end 25 having receiver and transmitter circuitry. The purpose of the FPGA smart buffer coprocessor 30 of the embodiment of FIG. 1(b) is to enable the integrated circuit 20 to be in a low-power sleep mode most of the time. The FPGA smart buffer coprocessor 30 offloads the data communications from the integrated circuit 20, allowing the embedded processor 20 to be in a low power state when data is being received and sent. The integrated circuit 20 is brought back to its normal operating mode only after the full data packet is received. The analog front end 25 serves as an interface between the FPGA smart buffer coprocessor 30 and the RFID reader 15, with the necessary receiver and transmitter circuitry to allow the RFID tag 10 to communicate with the RFID reader 15.

As discussed elsewhere herein, the typical format for RFID communications between the RFID reader 15 and the RFID tag 10 is a set of commands from the RFID reader 15, known as primitives, and a corresponding response or action of the RFID tag 10. The primitives vary among the numerous known standards and often need to be augmented, by creating additional custom primitives, based on the needs of particular custom applications. The methodology and compilation flow of the present invention automatically creates HDL code for the creation (i.e., programming in the case of an FPGA) of the integrated circuit 20 based on a description of the primitives and corresponding responses to be implemented.

FIG. 3 is a schematic flow diagram of the methodology and compilation flow of the present invention, as implemented in an RFID application. Again, as noted above, implementation in an RFID application is only one embodiment of the present invention, and it will be appreciated that the invention can be used in connection with other suitable IC applications. The RFID primitives from the applicable standards specification, represented at 35, the proprietary extensions (custom primitives), if any, represented at 40, and the corresponding response to each are, as represented at 45, first converted into simple assembly-like descriptions referred to as RFID macros. The RFID macros could also be described using existing languages like XML or even using a graphical interface. Next, an RFID parser, represented at 50, reads the RFID macros and builds them into an RFID compiler, represented at 55. The user then defines the behavior of the RFID tag 10 in response to each RFID primitive in a suitable programming language, which preferably is ANSI C (i.e., the user specifies the responses). To simplify the user interaction, the RFID parser, represented at 50, automatically generates templates, represented at 60, indicating where the user must specify behavior. The user writes simple constructs, preferably ANSI C constructs, represented at 65, to describe the required RFID tag 10 by completing the templates. The completed RFID behavior in the form of the constructs, preferably ANSI C constructs, are then fed into a C to HDL Translator 70 which generates HDL code, such as VHDL code, from the contructs. The output of the C to HDL Translator 70 (described in further detail below) is fed into the RFID compiler 55 (along with the output of the RFID parser as described above) and combined with automatically generated HDL. The RFID compiler 55 then generates and outputs synthesizable HDL, such as synthesizable VHDL, which describes the operation of the integrated circuit 20.

The RFID compiler 55 operates in much the same way as the RFID compiler 5 described in co-pending application Ser. No. 11/406,194 referenced elsewhere here, except that instead of outputting an application in the C programming language that is compiled for an embedded microprocessor as is the case with the RFID compiler 5, the RFID compiler 55 instead outputs similar code in synthesizable HDL format, e.g., synthesizable VHDL format. The synthesizable HDL is then fed into one or more software design tools, represented at 75, which are used to generate the layout for the integrated circuit 20. For example, in the case where the integrated circuit 20 is an FPGA, the synthesizable HDL is synthesizable VHDL and the software design tools, represented at 75, are used to synthesize, map, place and route the synthesizable VHDL for the target FPGA (the integrated circuit 20).

In the preferred embodiment, the C to HDL Translator 70 is implemented in accordance with the SuperCISC compilation flow described in A. K. Jones, R. Hoare, D. Kusic, et al. "Computation Techniques for FPGAs: An FPGA-based VLIW Processor with Custom Hardware Execution," 13*th ACM Intl. Sym. on Field-Programmable Gate Arrays* (FPGA'05), Monterey, Calif., February 2005, pp. 107-17, and Raymond R. Hoare, Alex K. Jones, Dara Kusic, et al., "Rapid VLIW Processor Customization for Signal Processing Applications Using Combinational Hardware Functions," *EURASIP Journal on Applied Signal Processing*, vol. 2006, Article ID 46472, 23 pages, 2006, the disclosures of which are incorporated herein by reference.

The following sections describe the example methodology and compilation flow in more detail.

1. Macros Specification

As described above, the simple assembly-like descriptions corresponding to the RFID primitives and their responses are termed RFID macros. As an illustration of the RFID macro representation, a primitive known as "Owner Id Write" has been selected from the ISO/IEC 18000-7:2004(E) standard. The format of the fields in the primitive and its response is illustrated in FIG. 3. As seen in FIG. 3, each RFID primitive has a unique field that serves as a type of command, called the command code or opcode. In addition to the command code, each RFID primitive contains a number of other fields of varying length as positions for data that is present. Similarly, the response to each RFID primitive has a number of fields of varying length as positions for data that is present.

FIG. 4 shows the RFID macros file corresponding to the Owner id write primitive shown in FIG. 3. Each RFID macro description has a short character string that corresponds to the name of the primitive, a number corresponding to the value of the command code or opcode, a set of operands corresponding to the primitive's format and a set of operands corresponding to the response format. In order to capture the details of the lengths of each field in the primitive, the macros file has been conceptually broken into a declarations section and a main section. The declarations section allows the user to pre-declare the lengths of all the fields that will occur in the primitives and the responses. This eliminates the need to specify each field's length multiple times, since a field can occur in multiple primitives and/or multiple responses. In the main section, the primitives and corresponding responses are defined in terms of the fields thereof. In some cases, the fields in the primitive or the response have nested fields of varying lengths. These fields can be described with ease as shown in FIG. 4, thereby providing the user with the capability to adopt any level of granularity in manipulating the primitives and/or responses. In the macro shown in FIG. 4, the string used to denote the Owner Id Write primitive is "ionw." The decimal value of the command code corresponding to the Owner id write primitive command is "137."

The RFID macros may be generated in the following manner. The initial step is to introduce an intermediate macro concept or representation, specifically termed an RFID macro representation, where the resulting macros convert the primitive from the specified standard form. The mechanism by which this is done is to provide for the user to specify the lengths of the fields actually present in the RFID primitive and in the corresponding response by the RFID tag. To implement the RFID macro, input fields consisting of short character strings represent the name of the primitive, the specific numerical value of opcode of the primitive prescribed as described in the standard, and any of the other fields corresponding to the primitive, and the corresponding fields that are to be specified in the response.

2. Template for Behavior

As discussed above, in an RFID system, such as RFID system 5, the RFID reader, such as RFID reader 15, transmits an RFID primitive to the RFID tag, such as RFID tag 10, through an air interface. The RFID tag has to respond to the primitive by way of changing its current state and/or transmitting a message back to the RFID reader. The nature of the RFID tag's behavior thus has to be specified so that it can be incorporated in the end synthesizable HDL described elsewhere herein. The user has to specify RFID tag behavior in a programming language such as ANSI C.

To make the user interaction simple, the RFID parser, represented at 50, generates a template for the response behavior based on the information in the macros file. Any programming (e.g., C) constructs (e.g., conditionals, loops, etc.) which are necessary to completely specify the behavior of each response can be added by the user. The template generated for the collection command primitive, referred to as "icol" in the macros specification shown in FIG. 4, is shown in FIG. 5(a). A file containing similar templates for all the macros that were included in the macros specification file will be generated for the user.

Templates may be generated in the following manner. First, the RFID macros that are generated are input into the RFID parser, represented at 50, which includes scanning and parsing stages. The scanning stage recognizes the individual field specifications (termed tokens) in the macros file created as described above. As in the classical case, the tokens then become the input to the parsing stage. The next step is for the parsing stage to convert the syntactic structure of the input macros file by making use of the built in grammar of the macros. This step is repeated until all tokens have been processed. The next step in the process is to create what is termed an abstract syntax tree, which is in fact an internal representation of the input macros. This resulting data structure encodes the information of all the macros, namely their names, opcodes, and the names and lengths of their fields.

The next step is to represent each response and each nested field in the response in the form of C language constructs termed structs. The details of the names and sizes of the fields in the response are present in the structs. Each struct is then converted into a form to create the templates that are presented to the user to allow the user to interact and input specific values.

Next, the user specifies what logical state the RFID tag, such as RFID tag 10, should be in when the particular RFID primitive (transmitted to the RFID tag) is received and the values of the fields of the response to be generated. Additionally, the user may use C language constructs such as conditionals, loops, etc. to check the values of the fields of the incoming RFID primitive, and to specify the values of the fields of the response.

All of the details regarding the size and the position of the fields in the primitive and in the response packet are built into the RFID compiler 55. Hence, the complexities of unpacking the primitive and packing the response are abstracted away from the user as can be seen in FIG. 5(a). However, the user's power to manipulate each individual field in the response has been preserved. The completed behavior for the same command is shown in FIG. 5(b), illustrating how simple C constructs can be used to plug in the response behavior of the RFID tag.

3. Creating and Compiling HDL (e.g., VHDL) Design Based on Macros and Completed Tag Behavior The final phase of the methodology is the HDL (e.g., VHDL) design generation based on the input macros specification and the tag behavior. Because, in the preferred embodiment just described, the primitive behaviors are specified by the user in the form of C code, that C code must be converted into synthesizable hardware code (HDL). This phase involves both the C to HDL Translator 70 and the RFID compiler 55. In particular, the RFID compiler 55, using inputs from both the RFID parser, represented at 50, and the C to HDL Translator 70, which converts the tag behavior in C into HDL as described below, generates decode instructions that identify the incoming RFID primitive. For each case of an incoming command, the RFID compiler 55 also creates routines that unpack the command into the fields that it is expected to have. The corresponding behavior is then attached to each case of an incoming command. The routines for packing the response are then generated. The result is that the final generated HDL (e.g., VHDL) design receives the incoming RFID primitive, identifies it based on the value of its opcode, unpacks it fields, executes its behavior, and packs its response and sends it to the interrogator.

FIGS. 6(a) and 6(b) shows certain of the steps that are employed by the C to HDL Translator 70 to convert the input tag behavior in C code into HDL. Specifically, FIGS. 6(a) and 6(b) show the conversion of the input C code into combinational hardware. First, the C code is represented in a control and data flow graph (CDFG) representation as shown in FIG. 6(a) for the "Owner id write" (iown) primitive. As is known in the art, CDFGs are commonly used within compilers for transformations and optimizations. The CDFG shown in FIG. 6(a) has the control flow graph (CFG) on the far left. The edges between each block represent control dependencies, which generally indicate that a decision must be made. Often, cycle boundaries are created due to control dependencies during synthesis of CDFGs. Each block in the CFG is a basic block containing a data flow graph (DFG). All of the basic blocks in the CFG are shown to the right of the CFG. Edges in the DFG represent data flow dependencies creating combinational flow (e.g., no cycle boundaries) during behavioral synthesis.

The C to HDL Translator 70 translates the CDFG into an entirely combinational representation called a super data flow graph (SDFG). This process preferably takes advantage of several well known compiler transformations such as loop unrolling and function inlining as well as a technique called hardware prediction to convert all control dependencies into data dependencies thereby creating an entirely combinational representation. The SDFG for the "Owner id write" (iown) primitive is shown in FIG. 6(b). The HDL output by the C to HDL Translator 70 is generated from the SDFGs that are created by it.

4. Extensibility

It is also important that the present invention be extensible such that it can be used in a potential RFID application scenario where the RFID tag, such as RFID tag 10, has the capability to respond to primitives from multiple standards (ISO and ANSI) and to proprietary primitives. For example, it is possible that suppliers might need to supply their RFID-tagged shipments to retailers in different countries who may mandate different RFID standards. In such a scenario, it would be greatly beneficial for the supplier to use RFID tags that are capable of responding to multiple standards. In addition, in the example of warehouse management, a supplier may want the RFID tags to have some proprietary primitives, such as setting and querying the positions, manufacture dates, prices, and product codes, etc. of the products. Thus, in the example shown in FIGS. 3, 4, and 5(a) and 5(b), the original macros file can be extended to add new primitives from, for example, ANSI as well as custom primitives. FIG. 7 shows the new macros specification file after a set of new primitives have been added to the original macros specification file from FIG. 3. The new macros that are being added correspond to the ANSI primitives "Get Error" (ager), and "Set Beeper On" (abpn), and the custom primitives "Set Position" (spos), "Get Position" (gpos), "Get Manufacture Date" (gdat) and "Get Product Code" (gcod). The new field declarations are appended to the declarations section, and the new macros declarations are appended to the main section in the original macros file. The template for the behavior of the tag is then generated as described herein in response to the current set of primitives. The user edits the templates to plug in the behavior, and the synthesizable HDL is generated as described herein.

Thus, the present invention provides a compilation flow that can automatically generate HDL for the creation of an IC, such as an FPGA or a silicon chip (ASIC), to be used in an RFID tag 10, based on a simple input description of the standards primitives and corresponding behavior. The invention is extensible, as it allows for addition or removal of a set of custom primitives that may be a subset or superset of the original standard. In addition, the invention can accommodate multiple, often competing, standards, such as ISO and ANSI, while serving the needs of current and future applications.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed is:

1. A method of designing an integrated circuit for use in an application having standards having a plurality of primitives, each of said primitives having a corresponding response, the method comprising:

generating a macros description of each of said primitives and the response corresponding to each of said primitives, said macros description including information relating to a number of first fields for each of said primitives and a number of second fields for the response corresponding to each of said primitives;

receiving a specification of a behavior of said integrated circuit in response to said primitives, said specification specifying one or more values for each of said second fields; and generating a hardware description language representation for said integrated circuit based on said macros description and said specification.

2. The method according to claim 1, further comprising generating a blank version of a template, said blank version of said template including each of said second fields, said specification comprising a completed version of said template, said completed version of said template having the one or more values specified for each of said second fields and specifying the behavior of said integrated circuit in response to said primitives.

3. The method according to claim 2, wherein said macros description is also a macros description of one or more custom primitives and a second response to each of said custom primitives, wherein said macros description further includes information relating to a number of third fields for each of said one or more custom primitives and a number of fourth fields for the second response corresponding to each of said one or more custom primitives, wherein said blank version of said template includes each of said fourth fields, and wherein said completed version of said template specifies one or more values for each of said fourth fields and also specifies a behavior of said integrated circuit in response to said one or more custom primitives.

4. The method according to claim 1, further comprising using said hardware description language representation to produce a layout for said integrated circuit and fabricating said integrated circuit using said layout.

5. The method according to claim 1, wherein said integrated circuit is an FPGA, the method further comprising programming said FPGA based on said hardware description language representation.

6. The method according to claim 1, wherein said hardware description language representation is a hardware description in VHSIC Hardware Description Language (VHDL).

7. The method according to claim 1, wherein said macros description includes a declarations section that sets forth a length of each of said first and second fields and a main section that lists, for each of said primitives, particular ones of said first fields that correspond thereto, and that lists, for each response, particular ones of said second fields that correspond thereto.

8. The method according to claim 1, said specification including constructs for specifying said behavior of said integrated circuit.

9. The method according to claim 1, wherein said integrated circuit is part of an RFID tag.

10. A computer software tool on a computer-readable medium for facilitating the design of an integrated circuit for use in an application having a plurality of primitives, each of said primitives having a corresponding response, said software tool having one or more computer executable routines adapted to:

enable the creation of a macros description of each of said primitives and the response corresponding to each of said primitives, said macros description including information relating to a number of first fields for each of said primitives and a number of second fields for the response corresponding to each of said primitives;

enable the creation of a specification of a behavior of said integrated circuit in response to said primitives, said specification specifying one or more values for each of said second fields; and generate a hardware description language representation for said integrated circuit based on said macros description and said specification.

11. The software tool according to claim 10, wherein said one or more computer executable routines are further adapted to generate a blank version of a template, said blank version of said template including each of said second fields, said specification comprising a completed version of said template, said completed version of said template having the one or more values specified for each of said second fields and specifying the behavior of said integrated circuit in response to said primitives.

12. The software tool according to claim 11, wherein said macros description is also a macros description of one or more custom primitives and a second response to each of said custom primitives, wherein said macros description further includes information relating to a number of third fields for each of said one or more custom primitives and a number of fourth fields for the second response corresponding to each of said one or more custom primitives, wherein said blank version of said template includes each of said fourth fields, and wherein said completed version of said template specifies one or more values for each of said fourth fields and also specifies a behavior of said integrated circuit in response to said one or more custom primitives.

13. The software tool according to claim 10, wherein said hardware description language representation is a hardware description in VHSIC Hardware Description Language (VHDL).

14. The software tool according to claim 10, wherein said macros description includes a declarations section that sets forth a length of each of said first and second fields and a main section that lists, for each of said primitives, particular ones of said first fields that correspond thereto, and that lists, for each response, particular ones of said second fields that correspond thereto.

15. The software tool according to claim 10, said specification including constructs for specifying said behavior of said integrated circuit.

* * * * *

UNITED STATES PATENT AND TRADEMARK OFFICE
CERTIFICATE OF CORRECTION

PATENT NO. : 7,480,876 B2  Page 1 of 1
APPLICATION NO. : 11/835687
DATED : January 20, 2009
INVENTOR(S) : Marlin H. Mickle et al.

It is certified that error appears in the above-identified patent and that said Letters Patent is hereby corrected as shown below:

On the cover sheet, second column, "Stacy A Whitmore" should be --Stacy A. Whitmore--.
On the cover sheet, second column, "Magid Y Dimyan" should be --Magid Y. Dimyan--.
Figure 3, line 2, "Interragator ID" should be --Interrogator ID--.
Figure 3, line 5, "Interragator ID" should be --Interrogator ID--.
Column 3, lines 43-44, "for a RFID primitive;" should be --for an RFID primitive;--.
Column 3, line 45, "FIGS. 6(a)" should be --FIG. 6(a)--.
Column 4, lines 24-25, "such FPGAs" should be --such as FPGAs--.
Column 6, line 16, "Owner id write" should be --Owner ID Write--.
Column 6, lines 37-38, "Owner id write" should be --Owner ID Write--.
Column 8, line 4, "unpacks it fields" should be --unpacks its fields--.
Column 8, line 12, "Owner id write" should be --Owner ID Write--.
Column 8, line 34, "Owner id write" should be --Owner ID Write--.
Column 8, line 54, "Thus, in the" should begin a new paragraph.

Signed and Sealed this

Twenty-third Day of June, 2009

JOHN DOLL
*Acting Director of the United States Patent and Trademark Office*